(12) United States Patent
Uchiyama

(10) Patent No.: US 8,164,129 B2
(45) Date of Patent: Apr. 24, 2012

(54) SEMICONDUCTOR DEVICE ENABLING FURTHER MICROFABRICATION

(75) Inventor: Hiroyuki Uchiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 401 days.

(21) Appl. No.: 12/458,143

(22) Filed: Jul. 1, 2009

(65) Prior Publication Data
US 2010/0001249 A1 Jan. 7, 2010

(30) Foreign Application Priority Data

Jul. 3, 2008 (JP) ................................ 2008-174605

(51) Int. Cl.
*H01L 27/108* (2006.01)
(52) U.S. Cl. .. 257/296; 257/306; 257/374; 257/E27.084
(58) Field of Classification Search .................. 257/296, 257/306, 374, E27.084
See application file for complete search history.

(56) References Cited

U.S. PATENT DOCUMENTS

| 6,632,723 B2 * | 10/2003 | Watanabe et al. ............. 438/421 |
| 2004/0224476 A1 * | 11/2004 | Yamada et al. ............... 438/400 |

FOREIGN PATENT DOCUMENTS

| EP | 1 003 219 A2 | 5/2000 |
| JP | 2000-164833 A | 6/2000 |

* cited by examiner

*Primary Examiner* — Minh-Loan T Tran
(74) *Attorney, Agent, or Firm* — Foley & Lardner LLP

(57) ABSTRACT

A semiconductor device includes a plurality of MOS transistors and wiring connected to a source electrode or a drain electrode of the plurality of MOS transistors and, the wiring being provided in the same layer as the source electrode and the drain electrode in a substrate, or in a position deeper than a surface of the substrate.

20 Claims, 9 Drawing Sheets

(A) (B) (C) (D)

(A) (B) (C) (D)

(A) (B) (C) (D)

(A) (B) (C) (D)

SEMICONDUCTOR DEVICE ENABLING FURTHER MICROFABRICATION

This application is based upon and claims the benefit of priority from Japanese Patent Application No. 2008-174605 filed on Jul. 3, 2008, the content of which is incorporated by reference.

BACKGROUND OF THE INVENTION

1. Field of the Invention

The present invention relates to a semiconductor device having a MOS (Metal Oxide Semiconductor) transistor and a method for manufacturing the same.

2. Description of Related Art

A DRAM (Dynamic Random Access Memory) is a device having a plurality of memory cells which combine a MOS transistor and a storage element serving as a capacitor. In a general memory cell, a gate electrode of the MOS transistor is formed on a silicon (Si) substrate. A line connecting the gate electrodes of the adjacent memory cells is called a word line.

Japanese Patent Laid-Open No. 2000-164833 has proposed a memory cell having a structure in which a word line is provided inside the substrate unlike a general memory cell structure. The disclosed memory cell uses a trench gate MOS transistor in which a word line is provided in a trench of the substrate.

In a general memory cell structure, a word line is formed on the Si substrate via a gate oxide film, and a wiring layer used for a bit line is formed on an upper layer above the word line. In order to electrically connect an impurity diffusion layer serving as a source electrode and a drain electrode of the MOS transistor provided on the Si substrate surface and a wiring layer serving as the bit line, a plurality of contact plugs need to be provided therebetween. Moreover, the wiring layer needs to be provided at a position not shorted to the storage element formed on an upper layer above the MOS transistor. For this reason, a contact forming method such as a self align contact is used to form a contact having electric insulation. Although there is increased demand for microfablication, it is difficult to create such a contact.

Furthermore, the memory cell structure proposed in Japanese Patent Laid-Open No. 2000-164833 is not sufficient to meet the request for further microfabrication.

SUMMARY

In one embodiment, there is provided a semiconductor device that includes a plurality of MOS transistors and wiring connected to the source electrode or the drain electrode of the plurality of MOS transistors, the wiring being provided in the same layer as the source electrode and the drain electrode in the substrate, or in a position deeper than the surface of the substrate.

In one embodiment, there is provided a method of manufacturing a semiconductor device that includes forming a first trench having a predetermined depth from a surface of a substrate, forming a second trench shallower than the first trench in a portion different from the first trench as well as forming a third trench in a position of exposed part of the first trench, forming an insulating film for element isolation in the third trench, forming a gate electrode of a MOS transistor in the first trench, forming a source electrode or a drain electrode of the MOS transistor in the surface of the substrate, and forming wiring connected to the source electrode or the drain electrode in the second trench.

According to the semiconductor device or the method for manufacturing the semiconductor, the distance between a source electrode or a drain electrode and the wiring connected to the source electrode or to the drain electrode becomes closer, which results in easily forming a contact plug for connecting the source electrode or the drain electrode to the wiring. Therefore, further microfabrication can be implemented.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

The DRAM memory cell structure in accordance with the present embodiment will be described.

Figure 1A:
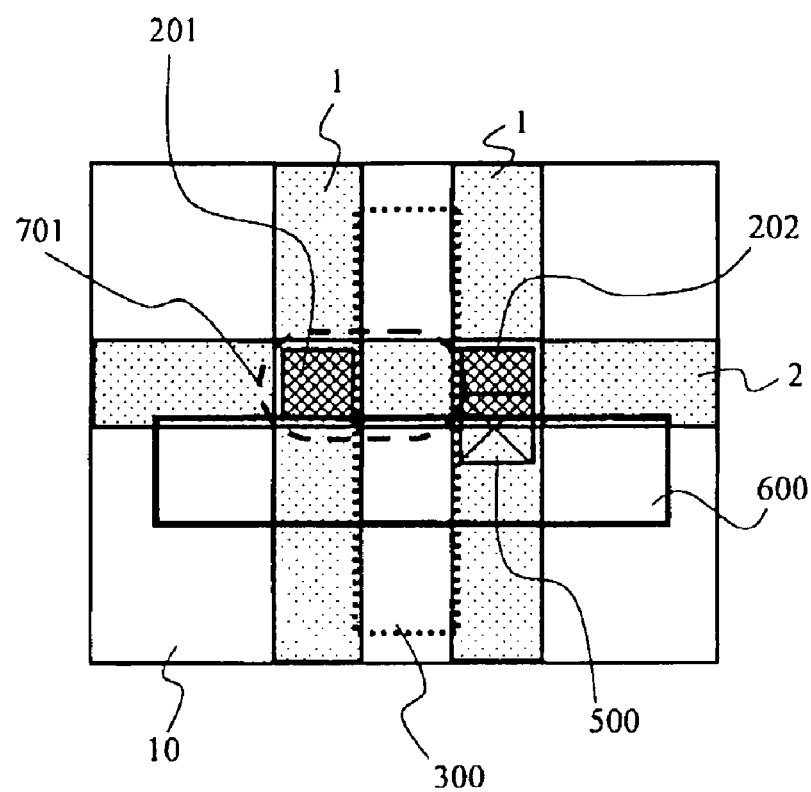
FIG. 1A is a plan view for explaining a memory cell pattern in accordance with a first embodiment.

FIG. 1A is a plan view for explaining a memory cell pattern in accordance with the present embodiment. The memory cell of the present embodiment uses an open bit line architecture and has an area of 6F2, where F denotes a feature size which means a minimum process to be used. Moreover, the memory cell is formed on a semiconductor substrate made of silicon (hereinafter referred to as Si substrate).

The memory cell in accordance with the present embodiment is configured to have a capacitor for storing information and a MOS transistor connected to the capacitor. The MOS transistor functions as an access transistor serving to read information from the capacitor or to write information into the capacitor. Hereinafter, the MOS transistor of the memory cell is referred to as the access transistor.

As illustrated in FIG. 1A, the access transistor includes drain electrode 201 and source electrode 202 in which conductive impurities are diffused from the surface of Si substrate 10 to a predetermined depth, and gate electrode 300. Source electrode 202 and drain electrode 201 are provided in a region where first active field pattern 1 and second active field pattern 2 are crossed respectively. Drain electrode 201 is connected to capacitor lower electrode 701. Source electrode 202 is connected to bit line 600 via a conductive film (not illustrated) provided at bit line contact 500. Note that a capacitor dielectric and upper electrode are not illustrated.

According to the memory cell in accordance with the present embodiment, gate electrode 300 is provided in a lower layer below the surface of Si substrate 10. Bit line 600 is provided in a lower layer below the conductive film provided in bit line contact 500. These structures will be described in detail later.

Figure 1B:
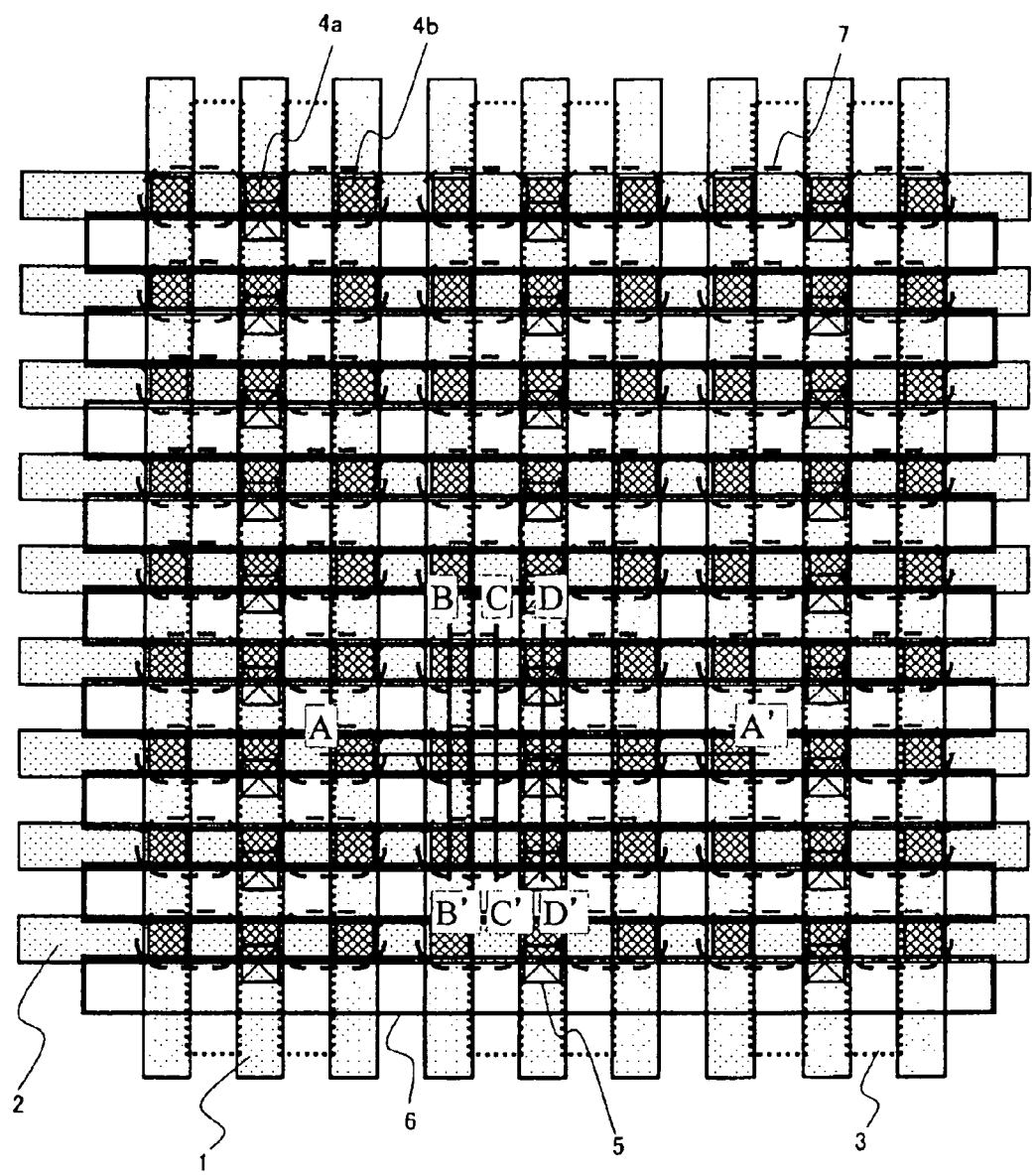
FIG. 1B is a plan view illustrating an exemplary configuration of a memory cell array having a plurality of memory cells in accordance with the first embodiment.

Hereinafter, the configuration of the memory cell array having a plurality of the above memory cells will be described. FIG. 1B is a plan view illustrating an exemplary configuration of the memory cell array having a plurality of memory cells in accordance with the present embodiment. In order to simplify the description of the memory cell features of the present embodiment, FIG. 1B illustrates a structure of memory cell fabrication in the middle of the process.

A plurality of gate electrodes 300 illustrated in FIG. 1A are connected in a predetermined direction to form a word line of the memory cell array. The word line in accordance with the present embodiment is formed by burying a conductive material in word line trench pattern 3 illustrated in FIG. 1B. Bit line 600 is formed by burying a conductive material in bit line trench pattern 6 illustrated in FIG. 1B. FIG. 1B is a plan view illustrating a state before the conductive materials are buried in word line trench pattern 3 and bit line trench pattern 6.

The memory cell array in accordance with the present embodiment has first active field pattern 1 and second active field pattern 2 and the two kinds of line shaped patterns are superimposed thereon. First active field patterns 1 are provided in parallel in the longitudinal direction of word line trench pattern 3. Second active field patterns 2 are provided in the direction perpendicular to the first active field patterns. The active field pattern means a pattern having a part where the surface of Si substrate 10 is left as is.

Word line trench pattern 3 is provided in a space sandwiched between first active field patterns 1. For three first active field patterns 1, two word line trench patterns 3 are provided. As illustrated in FIG. 1B, one word line trench pattern 3 is sandwiched between two first active field patterns 1.

According to the memory cell having a trench gate MOS transistor as illustrated in Japanese Patent Laid-Open No. 2000-164833, a wiring pattern for connecting the adjacent transistor gate electrodes to each other is provided separately from that for gate electrodes. In contrast, according to the present embodiment, a structure where the conductive material is buried in word line trench pattern 3 is used not only to form the gate electrode itself but also to connect the gate electrodes to each other.

Bit line trench pattern 6 is provided in a space between second active field patterns 2 orthogonal to above word line trench pattern 3. For one second active field pattern 2, one bit line trench pattern 6 is provided.

A diffusion layer in which conductive impurities are diffused from the surface of Si substrate 10 to a predetermined depth thereof is formed in a portion where first active field pattern 1 and second active field pattern 2 are crossed. The diffusion layer corresponds to source electrode 202 or drain electrode 201 illustrated in FIG. 1A.

On the diffusion layer, there are provided capacitor lower electrode 701 illustrated in FIG. 1A, and contact patterns 4a and 4b for connecting to bit line 600. Bit line contact pattern 5 for connecting the diffusion layer to bit line 600 via contact pattern 4a is arranged so as to create a bridge between second active field pattern 2 and bit line trench pattern 6. Moreover, on contact pattern 4b, there is provided capacitor pattern 7 for forming a capacitor including a capacity storage electrode. The capacity storage electrode corresponds to capacitor lower electrode 701 illustrated in FIG. 1A.

By using FIGS. 1A and 1B, a case has been described with an emphasis on the pattern formed on the semiconductor substrate, but during the DRAM fabrication process, another pattern is formed on an insulating film, a conductive film or a resist film. The examples thereof include a pattern for specifying an ion implantation region as needed, a pattern for forming a capacitor facing a plate electrode, a metal wiring pattern provided in an upper layer above the capacitor, and a through-hole pattern for inter-wire connection. These patterns are not illustrated and a detailed description thereof is omitted.

Figure 2:
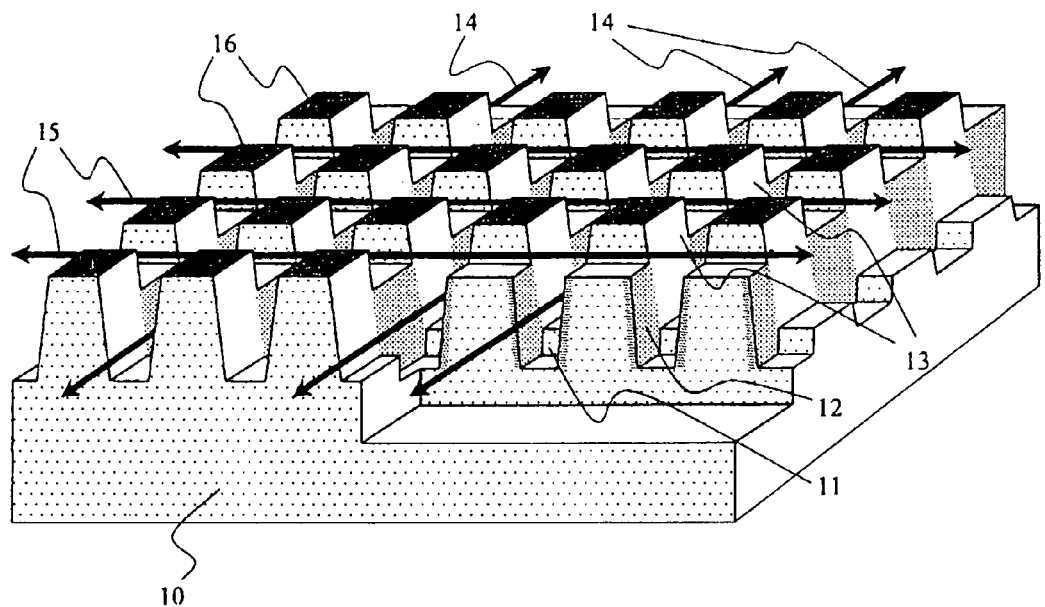
FIG. 2 is an external view seen from obliquely upward of a three-dimensional structure of the memory cell array of FIG. 1B after the memory cell array is formed on a substrate.

FIG. 2 is an external view seen from obliquely upward of a three-dimensional structure of the memory cell array of FIG. 1B after the memory cell array is formed on a substrate. FIG. 2 schematically illustrates a state where first active field pattern 1 and second active field pattern 2 are formed on the surface of Si substrate 10.

As illustrated in FIG. 2, the portions close to the surface of Si substrate 10 after formation serve as diffusion layer regions 16 corresponding to a source electrode and a drain electrode of the access transistor. As illustrated by arrows in two directions in FIG. 2, trenches extending in two different directions are formed. These trenches are different in depth and cross each other. Preferably, as illustrated in FIG. 2, these trenches are orthogonal. The word line is formed in a deep trench illustrated by one arrow. The direction is referred to as word line lengthwise direction 14. The bit line is formed in a shallow trench illustrated by the other arrow. The direction is referred to as bit line lengthwise direction 15.

The bit line and the word line are orthogonally crossed in different layers respectively so as to reduce the overlapped region of the two lines as much as possible via an insulating film. Therefore, the electric interference can be suppressed.

The word line provided in a trench shown by word line lengthwise direction 14 functions as a gate electrode of the trench gate MOS transistor in a region sandwiched between diffusion layer regions 16. The word line portion functioning as the gate electrode is electrically insulated from a channel portion by the gate oxide film. On the one hand, the word line portion excluding the gate electrode is electrically isolated from Si substrate 10 by trench 11 in which an STI (Shallow Trench Isolation) structure is formed and by channel protection region 12. If the MOS transistor is an N type, a high concentration P-type conductive impurity is introduced in channel protection region 12. Note that in FIG. 2, for convenience of description, trench 11 points to a portion where the STI structure is formed and the insulating material of the STI is not illustrated.

Trench 11 is provided under the word line, and is provided in a region where a space sandwiched between two first active field patterns 1 and a space sandwiched between two second active field patterns 2 are crossed. Trench 11 is formed in a portion where silicon is removed by etching Si substrate 10 twice. Channel protection region 12 is a region where the conductive impurity, which has the same conductive impurity that is diffused in Si substrate 10, is introduced in a higher concentration than Si substrate 10 on a trench wall side provided along word line lengthwise direction 14. According to the present embodiment, a case has been described where a well is not provided in Si substrate 10. If a well is provided in Si substrate 10, the conductive impurity, which is the same kind of the conductive impurity that is diffused in the well, is introduced in channel protection region 12 with higher concentration than the well.

Moreover, diffusion layer region 16 is provided at the same depth position as the bit line. Electrical isolation between diffusion layer regions 16 in bit line lengthwise direction 15, is provided by trench 13 in which the STI structure is formed and by the insulating film provided on the word line. Note that in FIG. 2, for convenience of description, trench 13 points to a portion where the STI structure is formed and the insulating material of the STI is not illustrated. Electrical isolation between diffusion layer regions 16 in word line lengthwise direction 14 is provided by a trench structure having a bit line and an insulating film covering the bit line.

Trench 11 is provided in a lower layer below the word line. According to the DRAM configuration in accordance with the present embodiment, trench 11 is located in the deepest position of the formed surface of Si substrate 10.

Now, the memory cell configuration in accordance with the present embodiment will be described with reference to sectional views.

FIGS. 3 to 6 are a sectional view by line A-A', line C-C', line B-B', and line D-D' illustrated in FIG. 1B respectively.

Figure 3:
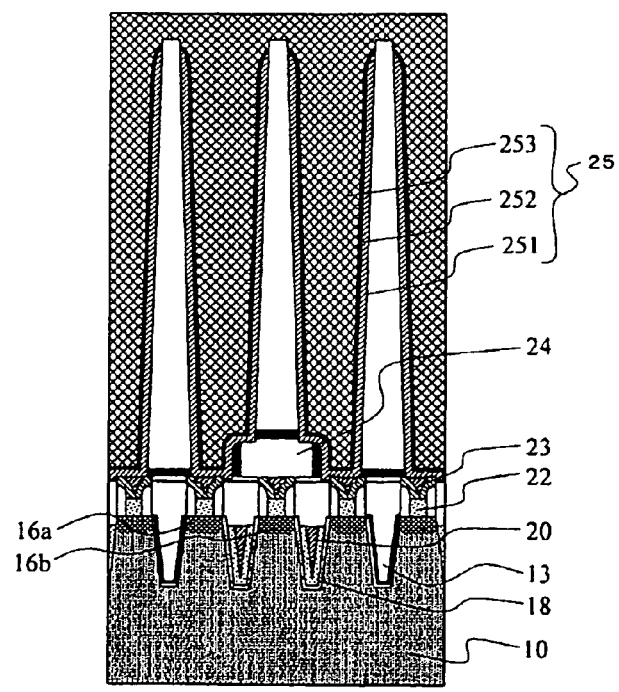
FIG. 3 is a sectional view illustrating a structure by line A-A' of FIG. 1B.
Figure 4:
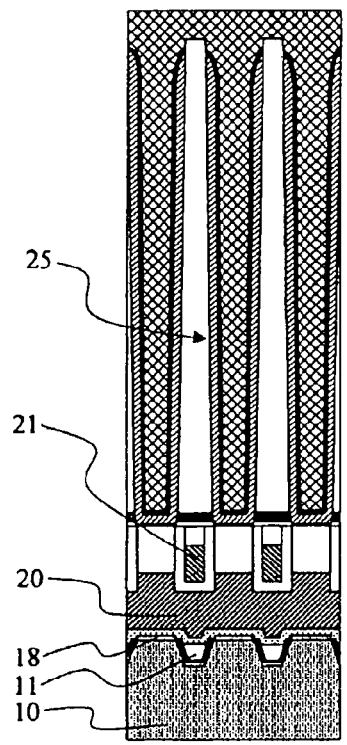
FIG. 4 is a sectional view illustrating a structure by line C-C' of FIG. 1B.

Three-staged trenches at upper, middle, and lower stages are provided in Si substrate 10. As illustrated in FIG. 3, the trench structure where word line 20 is formed and the STI structure for electrically insulating diffusion layer regions 16a and 16b correspond to trench 13 at the middle stage. As illustrated in FIG. 4, the STI structure which is located in a lower layer below word line 20 and which is provided to isolate the channel region of the MOS transistor corresponds to the lower-stage trench 11. As illustrated in FIG. 4, a trench which is located in an upper layer above word line 20 and bit line 21 and which is buried therein corresponds to the upper-stage trench.

Figure 5:
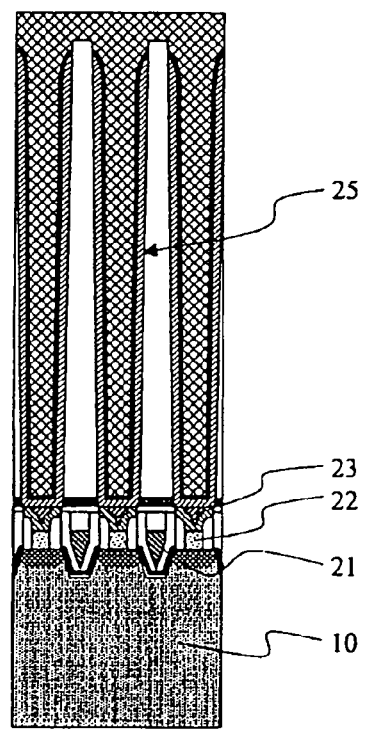
FIG. 5 is a sectional view illustrating a structure by line B-B' of FIG. 1B.
Figure 6:
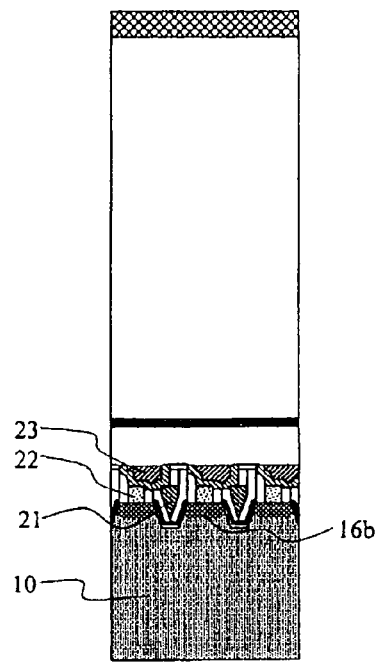
FIG. 6 is a sectional view illustrating a structure by line D-D' of FIG. 1B.
Figure 7:
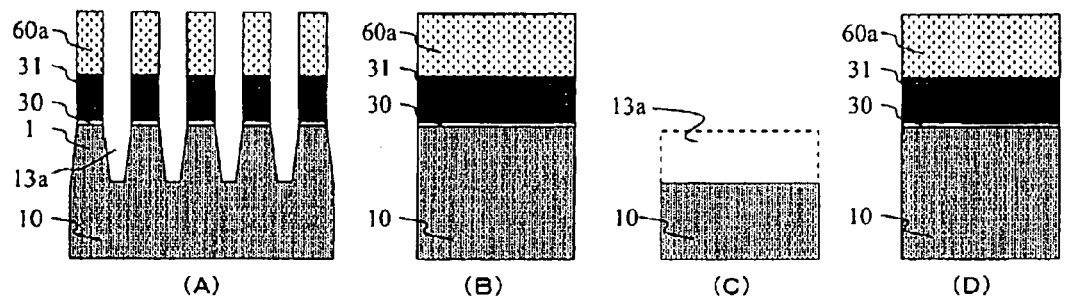
FIGS. 7(A)-7(D) are sectional views illustrating a structure after a first trench has been formed in the memory cell manufacturing method in accordance with the first embodiment.
Figure 8:
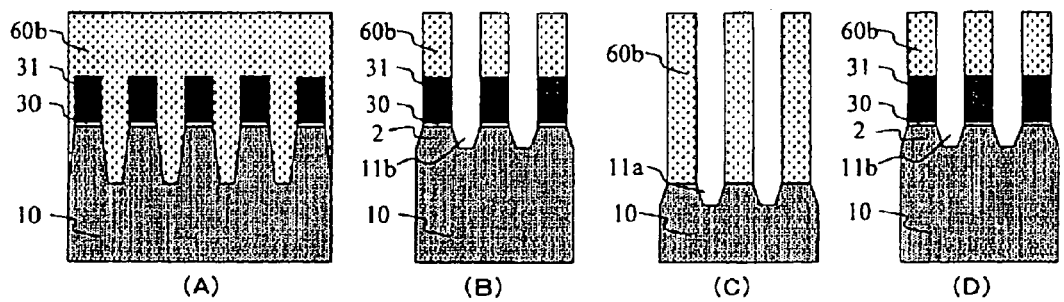
FIGS. 8(A)-8(D) are sectional views illustrating a structure after a second trench has been formed in the memory cell manufacturing method in accordance with the first embodiment.
Figure 9:
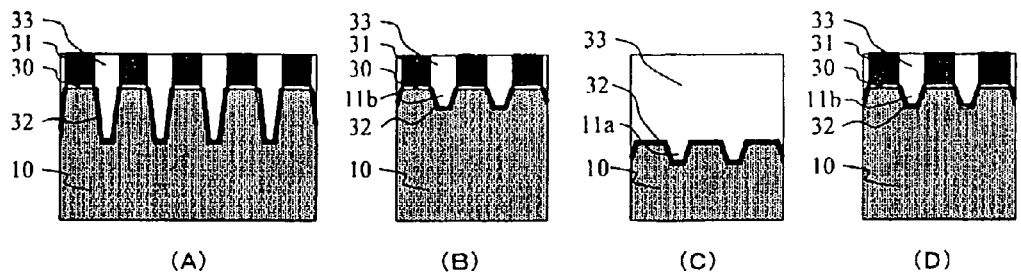
FIGS. 9(A)-9(D) are sectional views illustrating a structure after formation of electrical isolation in the memory cell manufacturing method in accordance with the first embodiment.
Figure 10:
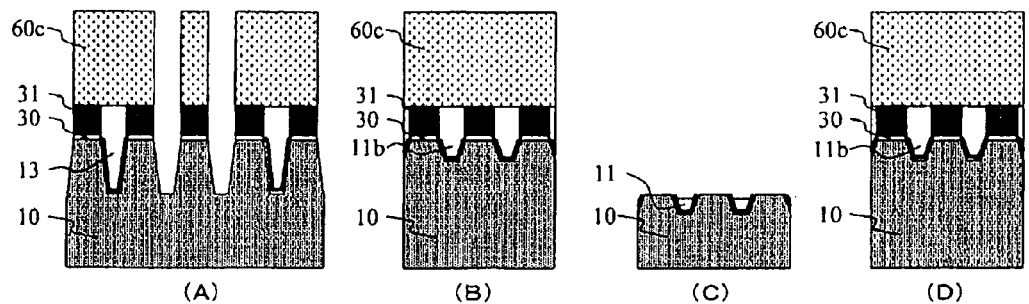
FIGS. 10(A)-10(D) are sectional views illustrating a structure after word line trench has been formed in the memory cell manufacturing method in accordance with the first embodiment.
Figure 11:
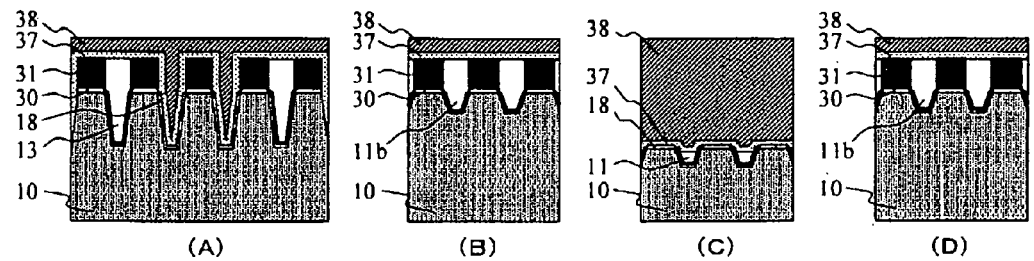
FIGS. 11(A)-11(D) are sectional views illustrating a structure after word line conductive film has been formed in the memory cell manufacturing method in accordance with the first embodiment.
Figure 12:
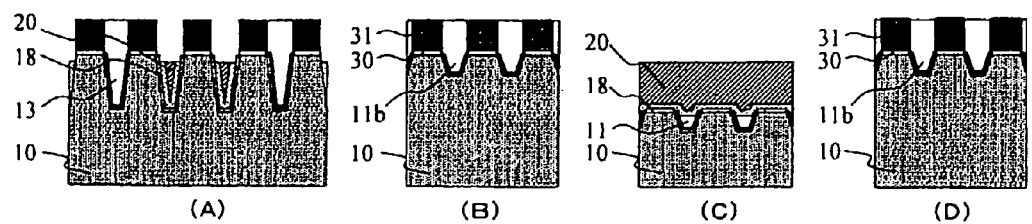
FIGS. 12(A)-12(D) are sectional views illustrating a structure after word line has been formed in the memory cell manufacturing method in accordance with the first embodiment.
Figure 13:
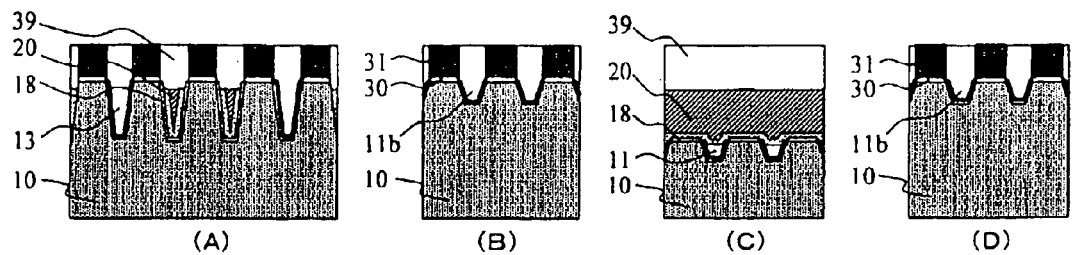
FIGS. 13(A)-13(D) are sectional views illustrating a structure after formation of an interlayer insulating film above the word line in the memory cell manufacturing method in accordance with the first embodiment.
Figure 14:
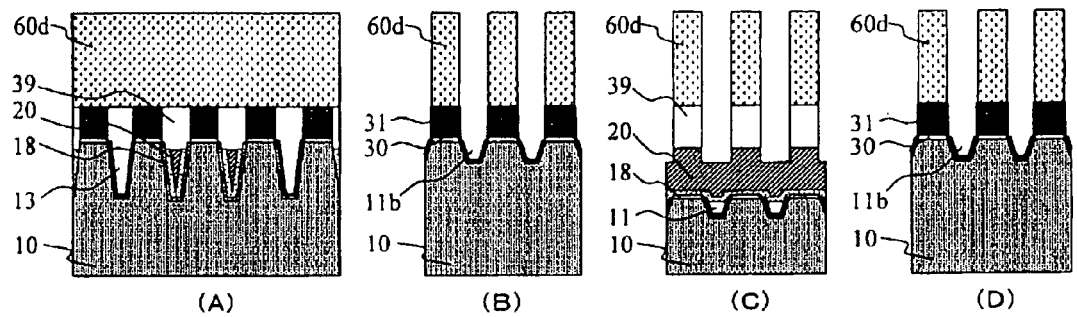
FIGS. 14(A)-14(D) are sectional views illustrating a structure after bit line trench has been formed in the memory cell manufacturing method in accordance with the first embodiment.
Figure 15:
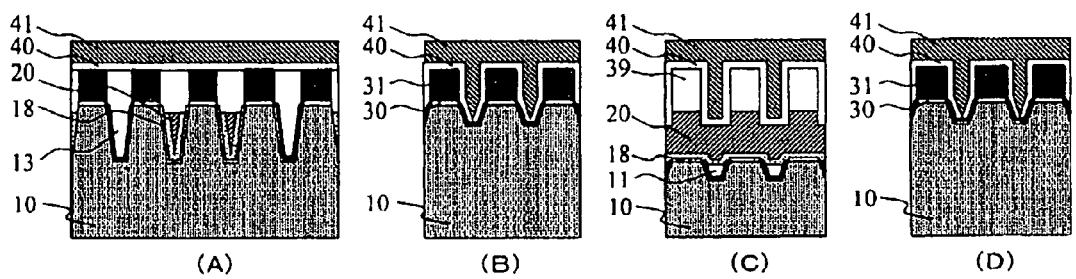
FIGS. 15(A)-15(D) are sectional views illustrating a structure after bit line conductive film has been formed in the memory cell manufacturing method in accordance with the first embodiment.
Figure 16:
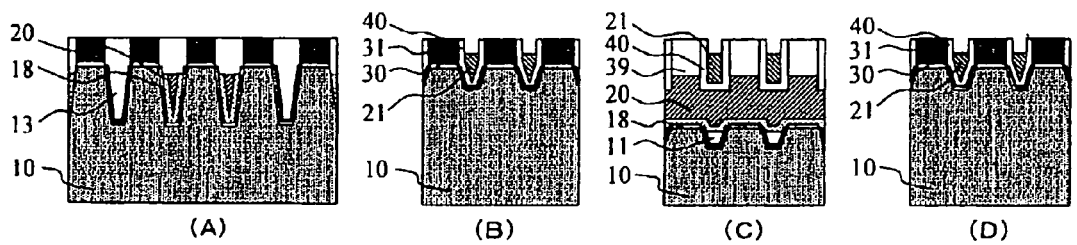
FIGS. 16(A)-16(D) are sectional views illustrating a structure after bit line has been formed in the memory cell manufacturing method in accordance with the first embodiment.
Figure 17:
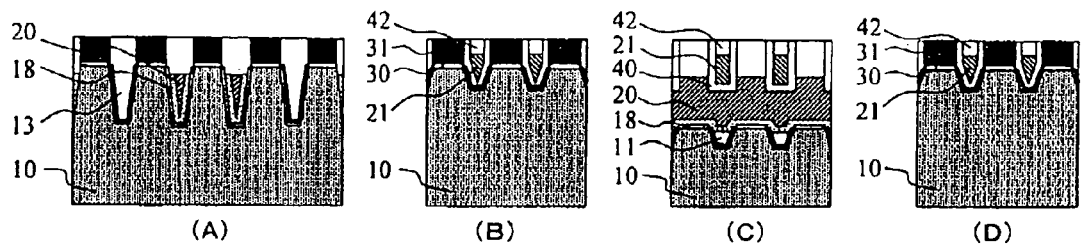
FIGS. 17(A)-17(D) are sectional views illustrating a structure after formation of an interlayer insulating film above the bit line in the memory cell manufacturing method in accordance with the first embodiment.
Figure 18:
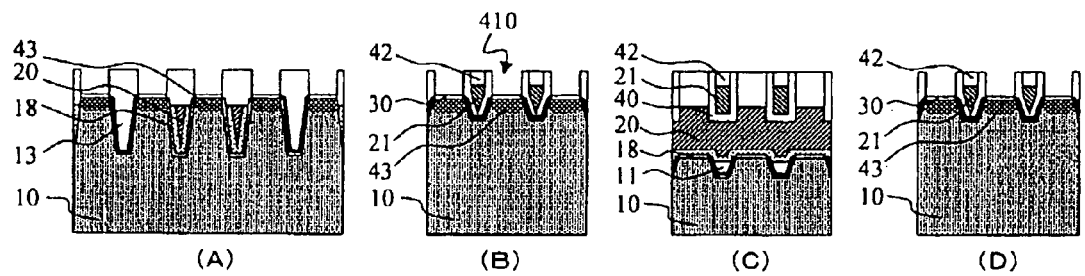
FIGS. 18(A)-18(D) are sectional views illustrating a structure after formation of a contact hole on a diffusion layer in the memory cell manufacturing method in accordance with the first embodiment.
Figure 19:
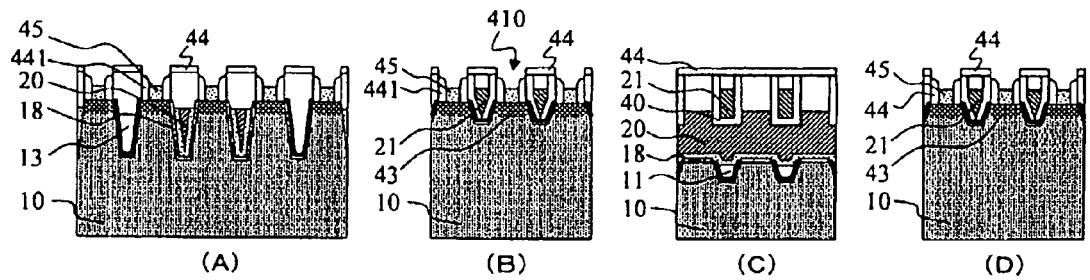
FIGS. 19(A)-19(D) are sectional views illustrating a structure after formation of an epitaxial layer inside the contact hole in the memory cell manufacturing method in accordance with the first embodiment.
Figure 20:
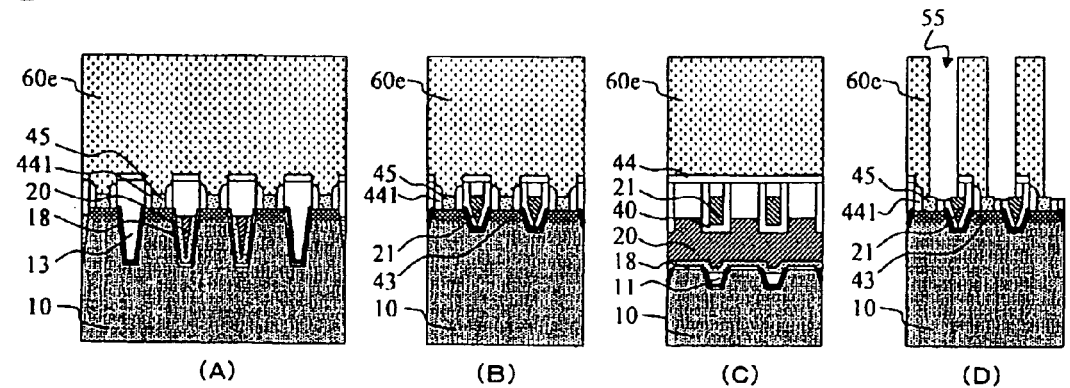
FIGS. 20(A)-20(D) are sectional views illustrating a structure after formation of a bit line contact hole in the memory cell manufacturing method in accordance with the first embodiment.

As illustrated in FIG. 3, word line 20 is completely buried in the middle-stage trench. As illustrated in FIGS. 5 and 6, bit line 21 is buried in the upper-stage trench, and a part thereof extends above the surface of Si substrate 10, but the extending portion is controlled to a minimum height within the range satisfying the wiring resistance specification. Controlling the height of the extending portion improves the flatness of the film formed above bit line 21.

As illustrated in FIG. 3, gate oxide film 18 is formed on a trench side wall between adjacent diffusion layer regions so as to surround word line 20. Diffusion layer region 16a corresponds to the drain electrode of the MOS transistor and is serially connected to lower electrode 251 of capacitor element 25 via contact plugs 22 and 23. This allows electrical information to be transferred between the MOS transistor and capacitor elements 25.

As illustrated in FIG. 6, diffusion layer region 16b is connected to bit line 21 via contact plugs 22 and 23. Cover structure 24 illustrated in FIG. 3 is provided in order to create electrical insulator between contact plug 23 connected to bit line 21 and capacitor element 25. It should be noted that the capacitor element is not limited to the illustrated structure, but a crown capacitor structure or pillar shaped structure may be used.

Hereinafter, the memory cell manufacturing method in accordance with the present embodiment will be described.

FIGS. 7 to 23 are a sectional view for explaining a major process of the memory cell manufacturing method in accordance with the present embodiment. (A), (B), (C), and (D) of the individual figure illustrates the respective sectional structure by line A-A', line B-B', line C-C', and line D-D' illustrated in FIG. 1B respectively.

As illustrated in FIGS. 7(B) and (D), oxide film (SiO$_2$) (hereinafter referred to as a surface oxide film) 30 and silicon nitride film (Si$_3$N$_4$) 31 are formed on the surface of P-type Si substrate 10 in that order, and then photoresist film 60a is applied thereto. Subsequently, as illustrated in FIGS. 7(A) and (C), photoresist film 60a remains only on first active field pattern 1 formed by a lithography technique, and in the same manner as in the STI forming method, the laminated films of surface oxide film 30 and silicon nitride film 31 and Si substrate 10 are etched by a dry etching method to form first trench 13a. This Si trench serves as element isolation between the diffusion layers and a channel portion of the MOS transistor. The depth thereof is determined by the capability of ensuring element isolation characteristics and the necessary channel length. For example, the depth is set to 200 nm.

Photoresist film 60a is removed and then photoresist film 60b is applied onto silicon nitride film 31. As illustrated in FIGS. 8(A), (B) and (D), photoresist film 60b remains only on active field pattern 2 formed by the lithography technique, silicon nitride film 31 and surface oxide film 30 are etched, and then, Si substrate 10 is etched to form a second trench and a third trench.

The second trench at a shallow stage from the surface of Si substrate 10 is formed in a portion where first trench 13a is not formed as illustrated in FIG. 8(B). The second trench corresponds to trench 11b for forming a bit line. The third trench at a deep stage from the surface of Si substrate 10 corresponds to trench 11a which is formed by further etching a portion where first trench 13a is formed as illustrated in FIG. 8(C).

The depth of trench 11b is determined by characteristics such as electrical resistance and parasitic capacitance of the bit line to be buried. The depth position of trench 11a and trench 11b to be formed differs, but the trench dept thereof is the same. The depth is set to, for example, 100 nm. After a second trench and third trench are formed, a P-type conductive impurity such as boron is introduced into a trench side wall portion using oblique ion implantation or the like to form channel protection region 12 as illustrated in FIG. 2.

Photoresist film 60b is removed and then the Si surface of the trench inner wall is cleaned with a chemical containing a dilute hydrofluoric acid or the like. Further, as illustrated in FIGS. 9(A) to (D), the Si surface is oxidized by a thermal oxidation method to form oxide film 32. From the point of view of stress relaxation and interface failure prevention, the film thickness of oxide film 32 is set to, for example, 8 nm. Although not illustrated, in order to prevent re-oxidation, the surface of oxide film 32 may be covered with silicon nitride film (Si$_3$N$_4$). Subsequently, oxide film 33 is formed by the HDP-CVD method so as to bury the inside of the trench. At this time, in order to bury the oxide film in the trench, the film thickness of oxide film 33 is set to about 1.0 or 2.0 times the trench width. Then, oxide film 33 is polished by the CMP method to expose the upper surface of silicon nitride film 31 as illustrated in FIGS. 9(A), (B), and (D).

Photoresist film 60c is applied onto oxide film 33 and silicon nitride film 31, and then, as illustrated in FIGS. 10(A) to (D), the portion of word line trench pattern 3 is removed from photoresist film 60c by the lithography technique. Using photoresist film 60c as a mask, oxide film 33 is etched to only expose the silicon surface inside the trench for burying a word line. At this time, as illustrated in FIG. 10(C), oxide film 33 buried in lowest trench 11a is left as is so as to form trench 11 having an STI structure for providing element isolation on the adjacent transistor channel portions.

After photoresist film 60c is removed, the Si surface is cleaned by a chemical containing dilute hydrofluoric acid, or the oxide film once formed by oxidation is removed so as to expose the silicon surface without impurities or damage. Afterward, as illustrated in FIGS. 11(A) and (C), gate oxide film 18 is formed on the silicon surface by the thermal oxidation method. Next, poly-Si film 37 and tungsten (W) film 38 are formed so as to bury an opened trench. In this case, for reaction prevention and resistance reduction at an interface between poly-Si film 37 and tungsten film 38, a tungsten nitride film or a tungsten silicide film may be inserted between the two films.

Subsequently, using a combination of the CMP method and the etch back method, as illustrated in FIGS. 12(A) to (D), tungsten film 38 and poly-Si film 37 formed above the upper surface of silicon nitride film 31 are removed, and further, the films are removed to a predetermined depth inside the trench. The depth from the upper trench end of the conductive film to be removed is determined by the depth to which the conductive film serving as the bit line is buried. The depth is set to, for example, about 70 nm. The conductive film left as is inside the trench serves as word line 20 as illustrated in FIGS. 12(A) and (C).

As illustrated in FIGS. 13(A) to (D), oxide film 39 is formed on the upper surface of the substrate by the CVD method. Then, a groove portion formed by removing a part of the conductive film is filled with an insulating film. Afterward, oxide film 39 is removed by the CMP method until the upper surface of silicon nitride film 31 is exposed so as to flatten the upper surface of the substrate.

After photoresist film 60d is applied onto oxide film 39 and silicon nitride film 31, using a lithography technique and an anisotropic dry etching technique, as illustrated in FIGS. 14(B) and (D), oxide film 33 on trench 11b is removed. Further, as illustrated in FIG. 14(C), oxide film 39 adjacent to trench 11b is removed corresponding to bit line trench pattern 6. FIG. 14(C) illustrates a state in which a part of the upper side of word line 20 is removed corresponding to the position of bit line trench pattern 6.

After resist film 60d is removed, as illustrated in FIGS. 15(A) to (D), oxide film 40 with a film thickness of 20 nm such that the trench could not be buried is formed on the surface of the substrate and the inside of the trench by the CVD method. Further, as illustrated in FIGS. 15(B) to (D), tungsten film 41 with a film thickness of about 50 nm is formed on the surface of the substrate and the inside of the trench by the CVD method so as to bury the trench having oxide film 40 formed on the side wall thereof. In this case, in order to improve the adhesion between tungsten film 41 and oxide film 40 and prevent the abnormal reaction thereof, a titanium nitride film and the like may be formed on oxide film 40 as an underlayer of tungsten film 41.

As illustrated in FIGS. 16(A) to (D), surface tungsten film 41 is removed by the etch back method to form bit line 21 as illustrated in FIGS. 16(B) to (D). At this time, a groove is formed on an upper portion of the trench in which bit line 21 is provided.

After oxide film 42 is formed by the CVD method so as to bury the groove illustrated in FIGS. 16(B) to (D), oxide film 42 is polished by the CMP method until the upper surface of silicon nitride film 31 is exposed to flatten the substrate surface (FIGS. 17(A) to (D)).

Subsequently, as illustrated in FIGS. 18(A), (B), and (D), silicon nitride film 31 is removed by a wet etching method using hot phosphoric acid. Thereby, contact hole 410 is formed in a self-aligning manner only on the Si substrate surface (diffusion layer region 16 illustrated in FIG. 2) at a position where first active field pattern 1 and second active field pattern 2 are crossed. Contact hole 410 corresponds to contact patterns 4a and 4b illustrated in FIG. 1B. Afterward, a conductive impurity is introduced in the range from the Si substrate surface of the bottom portion of contact hole 410 to a predetermined depth by the ion implantation method to form diffusion layer 43. This diffusion layer 43 serves as source electrode 202 and drain electrode 201 of the MOS transistor illustrated in FIG. 1A.

Oxide film 44 is formed on the substrate surface by the CVD method, a resist film (not illustrated) is applied thereonto, an opening is formed in the resist film (not illustrated) at a position corresponding to contact hole 410 by a lithography technique.

Using anisotropic etching by a dry etching method, as illustrated in FIGS. 19(A), (B), and (D), side wall 441 is formed on an inner wall of contact hole 410 by oxide film 44. Afterward, the resist film is removed. As illustrated in FIGS. 19(A) to (D), the entire portion except the contact holes is covered with oxide film 44. Then, silicon epitaxial layer 45 is grown in a position not covered with side wall 441 of the surface of diffusion layer 43 by a selective epitaxial method. Silicon epitaxial layer 45 corresponds to contact plug 22 illustrated in FIGS. 3, 5 and 6.

As illustrated in FIGS. 20(A) to (C), photoresist film 60e is applied onto silicon epitaxial layer 45 and a cap layer, and then contact hole 55 is patterned on photoresist film 60e by the lithography technique. Contact hole 55 corresponds to bit line contact pattern 5 illustrated in FIG. 1B. Subsequently, using photoresist film 60e as a mask, by the dry etching method, oxide films 40, 42, and 44, and the oxide films on side wall 441 and cap layer 442 are etched. Thereby, as illustrated in FIG. 20(D), a part of the upper surface of bit line 21 and a part of the upper surface of silicon epitaxial layer 45 are exposed to form contact hole 55.

After resist film 60e is removed, a titanium (Ti) film is thinly formed on the substrate surface by a sputtering method. Then, titanium nitride (TiN) film 46 and tungsten film 47 are sequentially formed on the titanium film by the CVD method so as to bury contact holes 410 and 55. Then, the conductive film is removed from the substrate surface by the CMP method to form contact plug 23 as illustrated in FIGS. 21(A), (B), and (D).

In a position where contact hole 410 is formed as illustrated in FIG. 19(B), contact plug 23 is connected to diffusion layer 43 of the substrate via silicon epitaxial layer 45 as illustrated in FIG. 21(B). Contact plug 23 illustrated in FIG. 21(B) is connected to a capacitor formed later. On one hand, in a position where contact hole 55 is formed as illustrated in FIG. 20(D), contact plug 23 is connected to bit line 21 as well as to adjacent diffusion layer 43 via silicon epitaxial layer 45 as illustrated in FIG. 21(D).

Subsequently, oxide film 48 is formed on contact plug 23 and cap layer 442 by the CVD method. Then, using the lithography technique and the dry etching method, as illustrated in FIGS. 22(A) and (D), a pattern of oxide film 48 is left as is on contact plug 23 connected to bit line 21 via silicon epitaxial layer 45. The remaining pattern of oxide film 48 corresponds to cover structure 24 as illustrated in FIG. 3.

Figure 23:
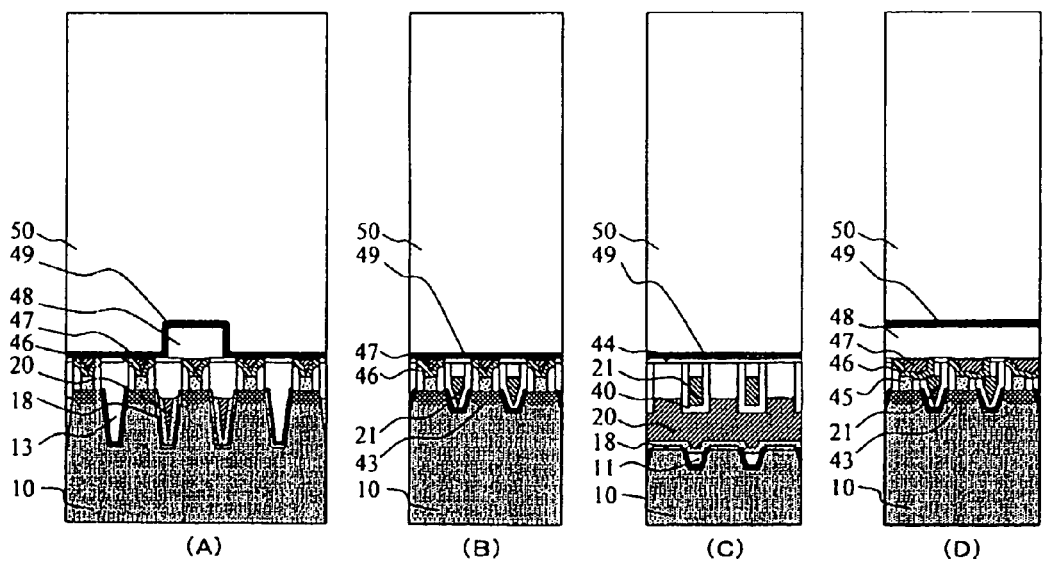
FIGS. 23(A)-23(D) are sectional views illustrating a structure after formation of insulating film for capacitor formation in the memory cell manufacturing method in accordance with the first embodiment.

Afterward, as illustrated in FIG. 23, silicon nitride film 49 serving as an etching stopper film is formed on the substrate with a film thickness of about 50 nm. Then, oxide film 50 that is thick, is created to form a capacitor. The film thickness is, for example, about 2 μm.

Further, a portion of capacitor pattern 7 is opened in oxide film 50 that is thick, and then films which are necessary to form the capacitor are formed. Thereby, a DRAM memory cell having a sectional structure as illustrated in FIGS. 3 to 6 is manufactured.

According to the semiconductor device in accordance with the present embodiment, the word line is provided inside the substrate. Therefore, the height of the word line from the substrate does not affect the subsequent process after the gate electrode is formed. Moreover, the bit line is located in the same layer position as the source electrode of the substrate. Therefore, the distance between the bit line and the source electrode is closer than in a case where an interlayer insulating film is provided between the bit line and the source electrode, and thus allows an easy connection therebetween. Further, the height of the bit line from the substrate is suppressed, and thus it is easy to ensure insulation of the contact plug provided between the bit lines.

In general, in an active region of the related MOS transistor, a channel region and a source/drain region are formed with the same pattern. As one of the patterns, there has been known a rectangular island pattern. Since the channel region and the source/drain region are of the same pattern, for example, in the case of a DRAM memory cell, a plurality of rectangular patterns with a large aspect ratio need to be provided as the active region. In contrast to this, according to the semiconductor device in accordance with the present embodiment, the channel region is formed in the depth direction of the substrate, and thus, such a rectangular pattern with a large aspect ratio described above is not needed.

According to the semiconductor device in accordance with the present embodiment, a pattern process using a lithography technique and an etching technique are performed on the semiconductor substrate surface a plurality of times to form three kinds of trenches each having a different depth. A first trench is used to bury the gate electrode of the MOS transistor using the inner wall of the trench as the channel region. A second trench is used to bury the lines for connecting a plurality of source electrodes or drain electrodes. A third trench is used to bury an insulating film inside the trench and to electrically isolate the adjacent MOS transistors. Note that in a region of the side wall of the first trench where the adjacent MOS transistors cannot be isolated with insulating film having such a thickness as the STI, a high concentration impurity is introduced in the side wall to increase the threshold which is sufficient to electrically isolate the adjacent MOS transistors.

Although not illustrated, the introduction of a conductive impurity necessary for forming the MOS transistor and the thermal process are performed as needed. Such processes is the same as the ordinary processes, part of such processes are disclosed in Japanese Patent Laid-Open No. 2000-164833, and thus a detailed description is omitted. Moreover, various stack-type capacitor structures such as a crown structure may be applied to the capacitor forming method in the same manner as in the related DRAM forming method. Although subsequent processes following the capacitor forming process are not illustrated, an upper layer wiring is formed in the same manner as in the related DRAM forming method to complete a DRAM product.

Further, according to the present embodiment, bit line 21 is located in a position higher than the Si substrate surface, but the upper surface of the bit line may be located in a position lower than the Si substrate surface by adjusting the etching condition or the like.

It should be noted that the individual process methods in the above described manufacturing method are just an example, and thus other process methods may be used. Moreover, the film thicknesses and sizes are just an example, and are not limited to the above described film thicknesses and sizes.

Second Embodiment

According to the present embodiment, the semiconductor device in accordance with the present invention is applied to a memory cell other than the DRAM.

According to the memory cell described in the first embodiment, instead of the capacitor element, a structure having a storage element using resistance change may be considered. The storage element using a change in resistance and the MOS transistor may be combined to form a memory cell such as a phase change memory (PRAM) and a resistive memory (ReRAM).

More specifically, in the case of phase change memory, the storage element, which includes a chalcogenide material (GeSbTe, etc.,) whose resistance changes with the phase change, may be formed instead of the capacitor element.

The method of manufacturing the semiconductor device in accordance with the present embodiment will be described with emphasis on only the processes that are different from the first embodiment.

Figure 21:
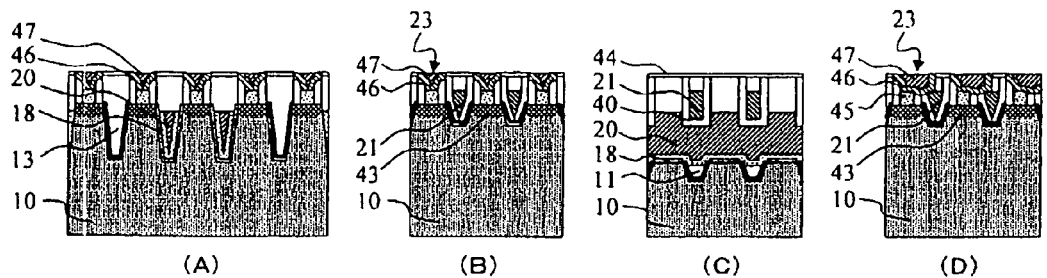
FIGS. 21(A)-21(D) are sectional views illustrating a structure after contact plug has been formed in the memory cell manufacturing method in accordance with the first embodiment.
Figure 22:
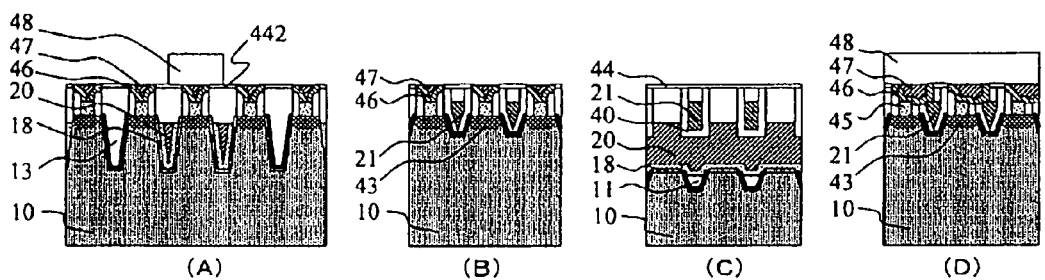
FIGS. 22(A)-22(D) are sectional views illustrating a structure after bit line contact plug protective film has been formed in the memory cell manufacturing method in accordance with the first embodiment.

In the same manner as in the first embodiment, bit line 21 and contact plug 23 are formed as illustrated in FIG. 21. Then, an interlayer insulating film is provided, and a storage element is formed thereon. Moreover, a contact plug is arranged so as to electrically connect the storage element to one of the source/drain regions not connected to the bit line of the MOS transistor.

According to the semiconductor device manufactured as above, the state (resistance) of the storage element can be determined by the current which flows when the MOS transistor is turned on.

The semiconductor device in accordance with the present invention has the following advantages and can easily improve microfabrication.

(1) The word lines connecting a plurality of memory cell gate electrodes are buried in a portion lower than the substrate surface, and thus the height of the word line from the substrate does not affect the subsequent processes after the gate electrode is formed.

(2) The bit lines are buried in a portion lower than the substrate surface or the contact plug on the diffusion layer, and thus the height of the bit line from the substrate is suppressed, and it is easy to ensure electrical insulation to the contact hole provided between the bit lines.

(3) In general, in terms of the characteristics of the lithographic process at pattern formation, the corner portions of the active region such as the source electrode and the drain electrode are round shaped, causing a problem in that the contact area to form contact plug is reduced, and there is not enough room for ensuring an alignment to form contact plug. This creates a disincentive for further microfabrication.

In view of the above problem, according to the present invention, the active region is formed by a combination of a trench pattern for forming a gate electrode and a trench pattern which is orthogonal thereto. For this reason, the substrate surface has a convex shape surrounded by the trench patterns, and the active region pattern formed thereon is of a substantially rectangular diffusion layer pattern. As a result, the corners of the active region pattern are of less round shapes, and thus it is easy to ensure the contact area to the contact plug and the alignment margin.

(4) The word line and the bit line are buried in a layer lower than the diffusion layer serving as the source electrode and the drain electrode of the MOS transistor, and thus the number of layers laminating the contact plug for connecting the diffusion layer and the storage element (such as capacitor) can be reduced. Therefore, this can reduce a high resistance fault in the contact plug interface and a fault due to positional misalignment when a plurality of contact plugs are aligned and thus improve the yield. Further, there is no need to use a complicated process such as self align contact technique for reducing the fault due to the positional misalignment, and thus costs can be reduced.

It should be noted that according to the first embodiment and the second embodiment, a case is described where the present invention is applied to a memory device, but the present invention is not limited to the memory device such as a DRAM, a PRAM and a ReRAM, but may be applied to a semiconductor device where a plurality of MOS transistors are arranged two-dimensionally continuously with a fine pitch. Further, in this case, the wiring provided in the substrate is not limited to the bit line, but may be any line as long as the line is connected to the source electrode or the drain electrode.

It is apparent that the present invention is not limited to the above embodiments, but may be modified and changed without departing from the scope and spirit of the invention.

What is claimed is:

1. A semiconductor device comprising:
   a plurality of MOS transistors including a source electrode and a drain electrode provided in a region from a surface of a substrate to a predetermined depth, and a gate electrode provided in a position deeper than these two electrodes in said substrate; and
   a wiring connected to one of said source electrode and said drain electrode and, said wiring being provided in substantially the same level in height as said source electrode and said drain electrode in said substrate, or in a position deeper than said surface of said substrate.

2. The semiconductor device according to claim 1, wherein said gate electrode is composed of a conductive material that is buried in a first trench provided in said substrate; and
   said wiring is composed of a conductive material is buried in a second trench provided in a position closer to said surface of said substrate than a bottom portion of said first trench.

3. The semiconductor device according to claim 2, further having a third trench provided in a position deeper in the substrate than the bottom portion of the first trench and having an insulating material buried therein for electrically insulating the adjacent MOS transistors.

4. The semiconductor device according to claim 1, wherein a word line configured, such that a plurality of said gate electrodes are connected, and said wiring, are crossed at a different depth in said substrate.

5. The semiconductor device according to claim 4, wherein said wiring is a bit line, and said bit line is disposed in the same layer as said source electrode and said drain electrode in said substrate.

6. The semiconductor device according to claim 5, further comprising a plurality of storage elements, wherein each of said storage elements is connected to corresponding one of said MOS transistors, and one of storage elements is selected by using said word line and said bit line.

7. The semiconductor device according to claim 6, wherein said storage element is a capacitor element.

8. The semiconductor device according to claim 1, wherein a storage element is provided corresponding to each of said plurality of MOS transistors.

9. A semiconductor device having a MOS transistor provided in a substrate, said semiconductor device comprising:
   a first trench provided in said substrate;

a second trench provided in said substrate so as to be orthogonal to said first trench and shallower than said first trench;

a third trench provided in a portion where said first trench and said second trench are crossed, said third trench being deeper than that of said first trench a gate electrode of said MOS transistor formed of a conductive material buried in said first trench via a gate insulating film;

a source electrode and a drain electrode of said MOS transistor formed in a position sandwiching said gate electrode in an upper surface portion of said substrate;

a first wiring layer formed of a conductive material buried in said second trench;

an insulating isolation region of said MOS transistor formed of an insulating material buried in said third trench; and a second wiring layer connecting said source electrode or said drain electrode to said first wiring layer.

10. The semiconductor device according to claim 9, further comprising first contact plugs connecting said source electrode and said drain electrode respectively;

wherein said second wiring layer comprises:

said first contact plug connecting said source or said first contact plug connecting said drain electrode; and a second contact plug connecting said first contact plug to said first wiring layer.

11. The semiconductor device according to claim 10, further comprising a storage element connected to said first contact plug, said storage element being connected to said source electrode or said drain electrode via a third contact plug which is not connected said first wiring layer.

12. The semiconductor device according to claim 11, further comprising: a word line which connects a plurality of said gate electrodes; and a bit line which includes said first wiring layer, wherein said MOS transistor is activated by using said word line, and data stored in said storage element are transferred by said bit line.

13. The semiconductor device according to claim 11, wherein said storage element is a capacitor element.

14. The semiconductor device according to claim 11, wherein said storage element is a resistance change element.

15. The semiconductor device according to claim 14, wherein said resistance change element includes phase change material.

16. A semiconductor device comprising:
a first diffusion layer having a predetermined depth from a surface of a substrate;
a second diffusion layer having the predetermined depth;
a first trench provided in the substrate;
a gate electrode being buried in the first trench and being fully embedded in the substrate;
a second trench provided in the substrate in a depth shallower than the first trench, the second trench intersecting nearly perpendicularly the first trench; and
a first conductive layer being buried in the second trench and being partially embedded in the substrate.

17. The semiconductor device according to claim 16, further having a third trench provided in a position deeper in the substrate than a bottom portion of the first trench and having an insulating material buried therein.

18. The semiconductor device according to claim 17, further comprising:
a second conductive layer contacting one of the first diffusion layer and the second diffusion layer;
a contact hole exposing both of a portion of the first conductive layer and a portion of the second conductive layer; and
a third conductive layer filling the contact hole and contacting both of the first conductive layer and the second conductive layer.

19. The semiconductor device according to claim 16, wherein the gate electrode having a top portion that is concave from the surface of the substrate and that is close to the surface of the substrate and that is close to the surface of the substrate than the predetermined depth.

20. The semiconductor device according to claim 16, wherein the gate electrode intersecting nearly perpendicularly and passing under the first conductive layer.

* * * * *